United States Patent
Aita et al.

(10) Patent No.: US 12,168,825 B2
(45) Date of Patent: Dec. 17, 2024

(54) FILM FORMATION METHOD AND FILM FORMATION DEVICE

(71) Applicant: Tokyo Electron Limited, Tokyo (JP)

(72) Inventors: Michitaka Aita, Nirasaki (JP); Ken Itabashi, Nirasaki (JP); Ryota Ifuku, Nirasaki (JP); Takaaki Kato, Nirasaki (JP); Kazuki Yamada, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 94 days.

(21) Appl. No.: 17/594,371

(22) PCT Filed: Apr. 6, 2020

(86) PCT No.: PCT/JP2020/015522
§ 371 (c)(1),
(2) Date: Oct. 13, 2021

(87) PCT Pub. No.: WO2020/213454
PCT Pub. Date: Oct. 22, 2020

(65) Prior Publication Data
US 2022/0178031 A1 Jun. 9, 2022

(30) Foreign Application Priority Data

Apr. 16, 2019 (JP) .................. 2019-077890

(51) Int. Cl.
*C23C 16/48* (2006.01)
*C23C 16/40* (2006.01)
(Continued)

(52) U.S. Cl.
CPC .......... *C23C 16/482* (2013.01); *C23C 16/401* (2013.01); *C23C 16/45553* (2013.01); *C23C 16/45565* (2013.01); *C23C 16/52* (2013.01)

(58) Field of Classification Search
CPC ............... C23C 16/482; C23C 16/401; C23C 16/45553; C23C 16/45565; C23C 16/52;
(Continued)

(56) References Cited

U.S. PATENT DOCUMENTS

2013/0196516 A1* 8/2013 Lavoie ............ C23C 16/45536
257/E21.293

FOREIGN PATENT DOCUMENTS

| JP | S64-14927 | * | 1/1989 | ........... H01L 21/318 |
| JP | S64-014927 A | | 1/1989 | |

(Continued)

OTHER PUBLICATIONS

Machine Translation, JP S64-14927 (Year: 1989).*
MAchine Translation, JP 64-14927 (Year: 1989).*

*Primary Examiner* — Michael G Miller
(74) *Attorney, Agent, or Firm* — Armstrong Teasdale LLP

(57) ABSTRACT

A film formation method includes: adsorbing a precursor of a film-forming raw material gas onto a surface of a substrate on which a film is to be formed by irradiating an interior of a processing container with ultraviolet light which has a first wavelength and separates a predetermined bond of the raw material gas while supplying the raw material gas into the processing container in which the substrate is disposed; and forming a layer, in which the precursor and a reaction gas react on the surface of the substrate, by supplying the reaction gas into the processing container.

5 Claims, 4 Drawing Sheets

(51) Int. Cl.
*C23C 16/455* (2006.01)
*C23C 16/52* (2006.01)

(58) Field of Classification Search
CPC .............. C23C 16/45536; H01L 21/31; H01L 21/02277; H01L 16/402; H01L 21/02164; H01L 21/02219; H01L 21/0228
See application file for complete search history.

(56) References Cited

FOREIGN PATENT DOCUMENTS

| | | |
|---|---|---|
| JP | 2003-045862 A | 2/2003 |
| JP | 2015-510263 A | 4/2015 |

* cited by examiner

FILM FORMATION METHOD AND FILM FORMATION DEVICE

CROSS-REFERENCE TO RELATED APPLICATIONS

This application is a National Stage Application of International Patent Application No. PCT/JP2020/015522, having an International Filing Date of Apr. 6, 2020, which claims the benefit of priority to Japanese Patent Application No. 2019-077890, filed Apr. 16, 2019, each of which is hereby incorporated by reference herein.

TECHNICAL FIELD

The present disclosure relates to a film formation method and a film formation apparatus.

BACKGROUND

Patent Document 1 proposes a technique of forming a film on a semiconductor wafer by providing a processing gas supply room, which is provided with an ultraviolet transmission window, outside a chamber, irradiating a processing gas inside the supply room with ultraviolet light from the ultraviolet transmission window to photoexcite the processing gas, and introducing the photoexcited processing gas into a reaction chamber.

PRIOR ART DOCUMENTS

Patent Documents

Patent Document 1: Japanese Laid-Open Patent Publication No. 2003-045862

SUMMARY

The present disclosure provides a technique capable of controlling the reactivity of a gas.

A film formation method according to an aspect of the present disclosure includes: adsorbing a precursor of a film-forming raw material gas onto a surface of a substrate on which a film is to be formed by irradiating an interior of a processing container with ultraviolet light which has a first wavelength and separates a predetermined bond of the raw material gas while supplying the raw material gas into the processing container in which the substrate is disposed; and forming a layer, in which the precursor and a reaction gas react on the surface of the substrate, by supplying the reaction gas into the processing container.

According to the present disclosure, it is possible to control the reactivity of a gas.

DETAILED DESCRIPTION

Hereinafter, embodiments of a film formation method and a film formation apparatus disclosed herein will be described in detail with reference to the drawings. The film formation method and the film formation apparatus disclosed herein are not limited by the embodiments.

A film formation method such as, plasma chemical vapor deposition (CVD), in which a gas as a material for film formation is supplied and the gas is reacted by heat or plasma to form a film. A gas has a number of excited states, reflecting the molecular structure thereof. In the conventional film formation method, since the gas is reacted by heat or plasma, the gas is in the state in which a plurality of excited states are mixed, and thus it is difficult to control the reactivity of the gas. Therefore, there is a demand to control the reactivity of the gas.

[Configuration of Film Formation Apparatus]

Figure 1:
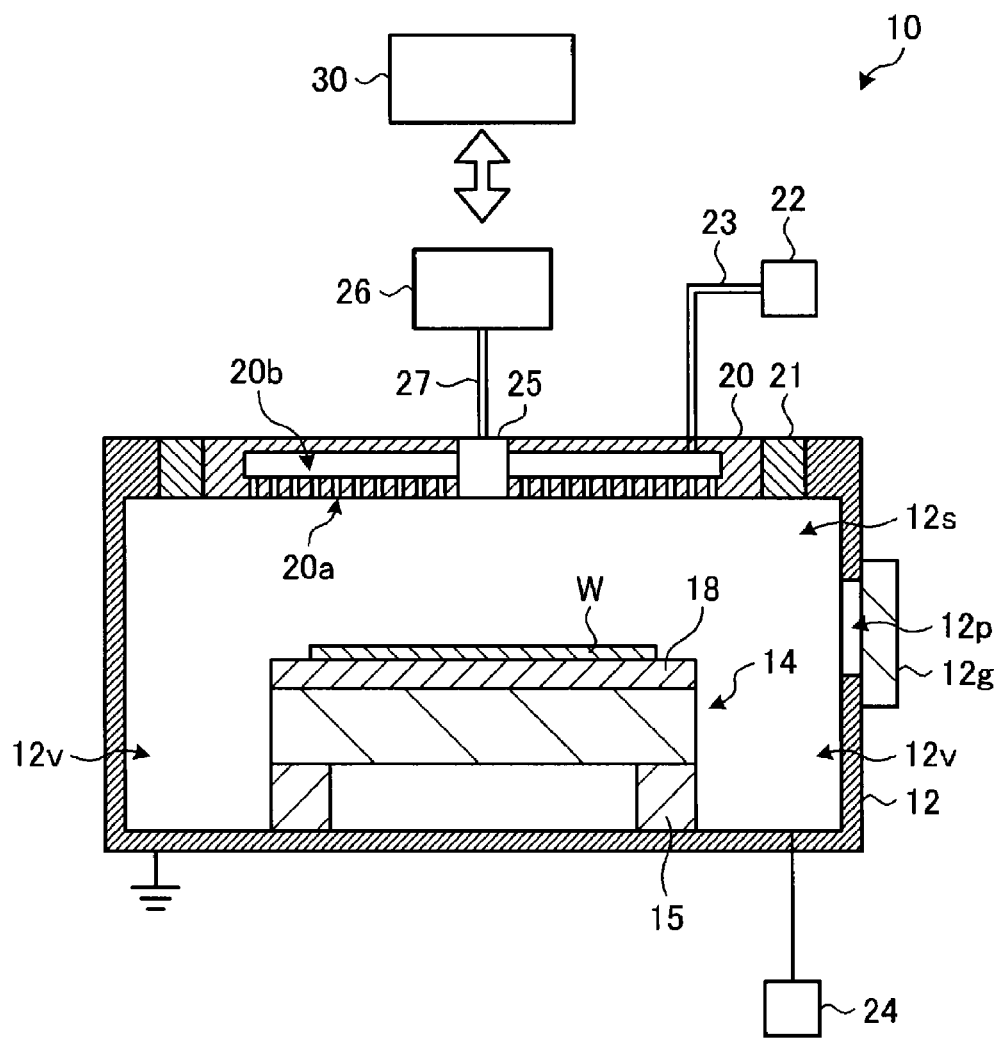
FIG. 1 is a view schematically illustrating a film formation apparatus according to an embodiment.

First, the configuration of a film formation apparatus 10 according to an embodiment will be described. FIG. 1 is a view schematically illustrating a film formation apparatus according to an embodiment. FIG. 1 schematically illustrates the structure of the film formation apparatus 10 according to the embodiment in a vertical cross section. The film formation apparatus 10 includes a processing container 12. The processing container 12 has a substantially cylindrical shape, and extends in the vertical direction. The processing container 12 has a substantially cylindrical sidewall, and a bottom continuous with the lower end of the sidewall. The processing container 12 provides an internal space 12s. The processing container 12 is made of a metal such as aluminum.

A passage 12p through which a substrate W, such as a semiconductor wafer, is loaded/unloaded is formed in the sidewall of the processing container 12. The substrate W passes through the passage 12p when transferred from the outside of the processing container 12 to the internal space 12s and when transferred from the internal space 12s to the outside of processing container 12. The passage 12p is openable/closable by a gate valve 12g. The gate valve 12g is provided along the sidewall of the processing container 12.

A stage 14 on which the substrate W is placed is provided in the internal space 12s of the processing container 12. The stage 14 has a substantially disk-like shape. The stage 14 is supported by a support 15. The support 15 is insulative and extends upwards from the bottom of the processing container 12.

The stage 14 is provided with an electrostatic chuck 18 on the upper portion thereof, and the substrate W is mounted on the top surface of the electrostatic chuck 18. The electrostatic chuck 18 includes a dielectric film and an electrode built in the dielectric film. The electrode of the electrostatic chuck 18 is a conductive film. A power supply is connected to the electrode of the electrostatic chuck 18 via a switch. When a voltage is applied to the electrode of the electrostatic chuck 18 from the power supply, an electrostatic attraction is generated between the electrostatic chuck 18 and the substrate W. The substrate W is attracted to the electrostatic chuck 18 by the generated electrostatic attraction, and is held by the electrostatic chuck 18.

The temperature of the stage 14 is controllable. For example, the stage 14 is provided with a temperature control mechanism such as a heater (not illustrated) therein, which makes it possible to control the temperature of the placement surface of the electrostatic chuck 18 on which the substrate W is placed. The substrate W is heated by the stage 14.

A shower head 20 is provided above the stage 14. A portion of the internal space 12s is interposed between the shower head 20 and the stage 14. In the present embodiment, the upper end of the processing container 12 is open. The shower head 20 is supported on the upper end of the processing container 12 via a member 21. The member 21 is insulative. The shower head 20 seals the opening at the upper end of the processing container 12 with the member 21.

The shower head 20 includes one or more conductive components. The one or more components of the shower head 20 are made of a material such as aluminum or silicon. Alternatively, the shower head 20 may include one or more conductive components and one or more insulative components.

The shower head 20 is provided with a plurality of gas ejection holes 20a and a gas diffusion chamber 20b. The plurality of gas ejection holes 20a extend downwards from the gas diffusion chamber 20b to the bottom surface of the shower head 20 on the internal space 12s side. A gas supplier 22 is connected to the gas diffusion chamber 20b via a gas supply pipe 23.

The gas supplier 22 supplies various gases used for film formation to the gas diffusion chamber 20b. For example, the gas supplier 22 includes a plurality of gas sources, a plurality of flow rate controllers, such as mass flow controllers, and a plurality of valves. Each of the gas sources is connected to the gas diffusion chamber 20b via a corresponding one of the flow rate controllers and a corresponding one of the valves. The gas supplier 22 adjusts a flow rate of a gas from a gas source selected from the gas sources, and supplies the gas to the gas diffusion chamber 20b. The gas supplied to the gas diffusion chamber 20b is supplied to the internal space 12s from each gas ejection hole 20a.

The film formation apparatus 10 according to this embodiment forms a film through atomic layer deposition (ALD). The gas supplier 22 individually supplies each of a raw material gas, a reaction gas, and a purge gas. Specific examples of the raw material gas, the reaction gas, and the purge gas will be described later.

The shower head 20 is provided with a transmission window 25 in the central portion thereof. The transmission window 25 is formed of a member that transmits ultraviolet light, such as quartz, and transmits ultraviolet light. The transmission window 25 is connected to the light source 26 via an optical fiber 27. The light source 26 is configured to generate ultraviolet light having a specific wavelength. The light source 26 outputs ultraviolet light having a specific wavelength to the optical fiber 27. The entire interior of the processing container 12 is irradiated with the ultraviolet light output from the light source 26 and passing through the optical fiber 27 and the transmission window 25. The film formation apparatus 10 according to the present embodiment is configured to be capable of irradiating the gas in the processing container 12 and the substrate W placed on the stage 14 with ultraviolet light by the light source 26, the optical fiber 27, and the transmission window 25.

An exhauster 24 is connected to the bottom of the processing container 12. The exhauster 24 is provided to communicate with the internal space 12s. The exhauster 24 includes a pressure controller, such as a pressure regulating valve, and a vacuum pump, such as a turbo molecular pump or a dry pump. By operating the exhauster 24, the gas present in the internal space 12s is discharged through a space 12v between the stage 14 and the sidewall of the processing container 12. In addition, the pressure in the internal space 12s is adjusted to a predetermined pressure by the exhauster 24.

The operation of the film formation apparatus 10 configured as described above is exclusively controlled by a controller 30. The controller 30 is, for example, a computer, and includes, for example, a central processing unit (CPU), a random access memory (RAM), a read only memory (ROM), and an auxiliary storage device. The CPU operates on the basis of a program stored in the ROM or the auxiliary storage device or a film formation process condition, and controls the overall operation of the apparatus. For example, the controller 30 controls the loading and unloading of the substrate W, the temperature of a heater (not illustrated) of the stage 14, and the pressure in the processing container 12. In addition, the controller 30 controls the start and stop of the supply of each gas from the gas supplier 22, the flow rate of each gas, and the radiation of ultraviolet light from the light source 26. The computer-readable program required for control may be stored in a storage medium. The storage medium includes, for example, a flexible disk, a compact disk (CD), a CD-ROM, a hard disk, a flash memory, or a DVD. In addition, the controller 30 may be provided inside or outside the film formation apparatus 10. In the case in which the controller 30 is provided outside the film formation apparatus 10, the controller 30 is capable of controlling the film formation apparatus 10 using a wired or wireless communication mechanism.

The film formation apparatus 10 may be configured to be capable of generating plasma in the processing container 12. In this case, for example, in the film formation apparatus 10, the stage 14 and the shower head 20 are formed of a conductive material such as aluminum. The film formation apparatus 10 connects a high-frequency power supply to one or both of the stage 14 and the shower head 20. Then, the film formation apparatus 10 may be configured to be capable of generating plasma in the processing container 12 by applying high-frequency power of a predetermined frequency from a high-frequency power supply to one or both of the stage 14 and the shower head 20. As the frequency of the high-frequency power used for plasma generation, a frequency in the range of 300 kHz to 5 MHz may be used. The surfaces of the stage 14 and the shower head 20 may be coated with a plasma-resistant coating. The inner wall surface of the processing container 12 may also be coated with a plasma-resistant coating. Examples of the plasma-resistant coating include ceramic films such as an alumite film and an yttrium oxide film.

[Flow of Film Formation]

Next, a specific example of a film formation using the film formation apparatus 10 will be described. In the following, a case in which film formation is performed through ALD using the film formation apparatus 10 will be described.

For example, when the film formation is performed, the gate valve 12g of the film formation apparatus 10 opens, the substrate W on which a film is to be formed is transferred onto the stage 14 through the passage 12p, and the gate valve G is closed. The controller 30 drives the exhauster 24 to reduce the pressure inside the processing container 12 to a predetermined degree of vacuum. Then, the controller 30 controls the gas supplier 22 to individually supply a raw material gas for film formation and a reaction gas from the gas supplier 22 into the processing container 12 with a purge gas for purging interposed therebetween, thereby implementing film formation through ALD. In addition, the controller 30 controls the light source 26 to irradiate the interior of the processing container 12 with ultraviolet light having a specific wavelength from the light source 26 via the optical fiber 27 and the transmission window 25 during the film formation.

For example, when forming a silicon oxide film, as the raw material gas, for example, an aminosilane gas, such as (bis(diethylamino)silane (BDEAS), DIPAS (diisopropylaminosilane), DMAS (dimethylaminosilane), or tridimethylaminosilane (TDMAS), may be used. As the reaction gas, an oxidizing gas, such as an oxygen ($O_2$) gas or a $H_2O$ gas, may be used. As the purge gas, an inert gas, such as an argon (Ar) gas, may be used.

The energy of ultraviolet light changes depending on the wavelength thereof. For example, the shorter the wavelength of ultraviolet light, the higher the energy. A gas has a number of excited states, reflecting the molecular structure thereof. A gas molecule absorbs ultraviolet light of various wavelengths. Therefore, by irradiating the gas molecule with ultraviolet light having a specific wavelength, the gas molecule can be selectively excited to a specific state. For example, by irradiating a gas molecule with ultraviolet light having a specific wavelength corresponding to the energy required to excite a specific electron bond of the gas molecule, only specific bonded electrons of the gas molecule can be excited. Since only specific bonded electrons of gas molecules can be excited in this way, it is possible to control the reactivity of the gas. For example, a gas molecule has an electron orbital that weakens chemical bonds and an electron orbital that promotes a reaction, depending on the excited state. Therefore, by radiating ultraviolet light having an appropriate wavelength to excite the gas molecule into a specific chemical bond state, it is possible to eventually break a specific chemical bond or promote a reaction.

For example, aminosilane gas has a Si—N bond. The Si—N bond can be broken by being irradiated with ultraviolet light having a wavelength in the range of 200 to 250 nm. In addition, when an $O_2$ gas is supplied together with the radiation of ultraviolet light having a wavelength in the range of 160 to 200 nm, oxidation can be promoted. Examples of the light source 26 capable of generating ultraviolet light having a wavelength in such a range include an excimer lamp and an excimer laser.

Figure 2:
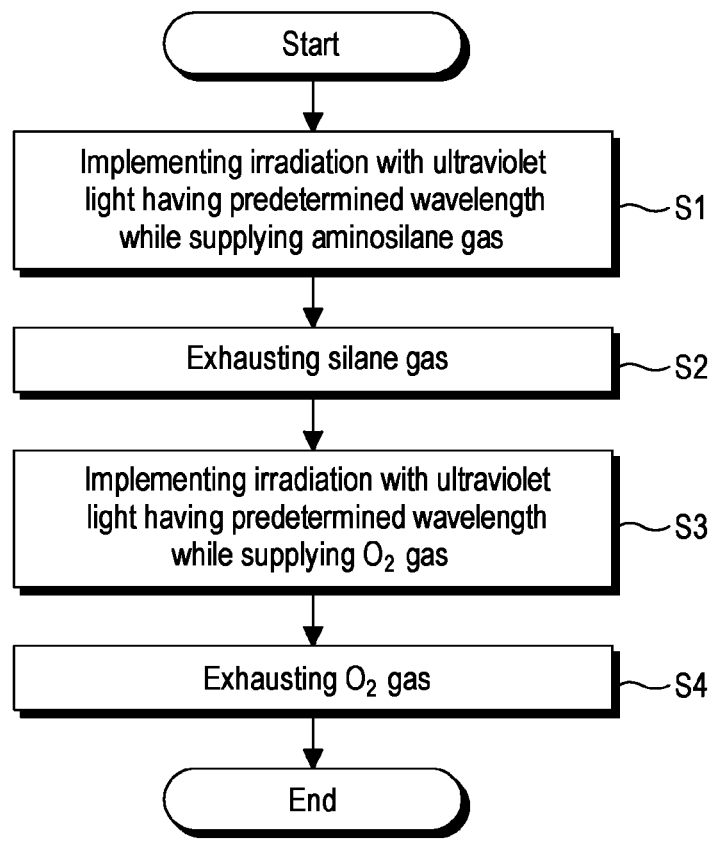
FIG. 2 is a view illustrating an example of a flow of a film formation process according to an embodiment.

Here, the flow of a film formation process implemented using the film formation apparatus 10 under the control of the controller 30 will be described. FIG. 2 is a view illustrating an example of a flow of a film formation process according to an embodiment.

In step S1, irradiation is implemented with ultraviolet light having a specific wavelength in the range of 200 to 250 nm from the light source 26 while aminosilane gas is supplied from the gas supplier 22. For example, in this embodiment, irradiation is implemented with ultraviolet light having a wavelength of 230 nm from the light source 26.

Figure 3:
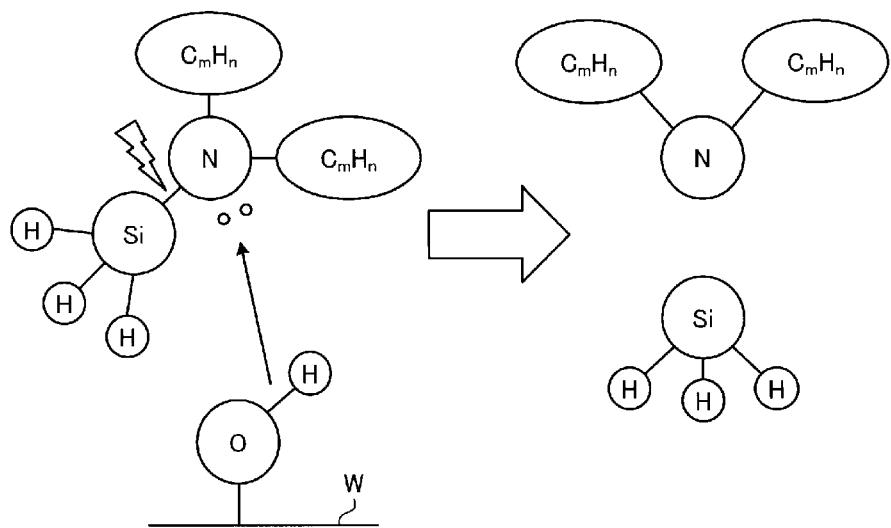
FIG. 3 is a view schematically illustrating a state of a molecule of aminosilane gas according to an embodiment.

FIG. 3 is a view schematically illustrating a state of a molecule of aminosilane gas according to an embodiment. FIG. 3 shows a portion of the molecular structure of aminosilane gas. Aminosilane gas has a molecular structure, such as $SiH_3$—N-2($C_mH_n$) and has a Si—N bond. When the aminosilane gas is supplied to the processing container 12, the portion of N-2($C_mH_n$) acts so that an aminosilane precursor is adsorbed onto the surface of the substrate W. However, when the aminosilane gas is irradiated with ultraviolet light having a wavelength of 230 nm, the Si—N bond is broken and separated into $SiH_3$ and N-2($C_mH_n$). Thus, it becomes difficult to adsorb the aminosilane precursor onto the surface of the substrate W.

As described above, the film formation apparatus 10 is able to control the adsorption of aminosilane onto the surface of the substrate W by irradiating the interior of the processing container 12 with ultraviolet light having a wavelength of 230 nm from the light source 26 while supplying an aminosilane gas.

Subsequently, in step S2, the supply of the aminosilane gas and the irradiation with ultraviolet light are stopped, a purge gas is supplied, and exhaust is performed to exhaust the aminosilane gas from the internal space 12s.

Subsequently, in step S3, the supply of the purge gas is stopped, and irradiation is implemented with ultraviolet light having a wavelength in the range of 160 to 200 nm from the light source 26 while an oxidation gas, for example, an $O_2$ gas, is supplied. For example, in this embodiment, irradiation is implemented with ultraviolet light having a wavelength of 172 nm from the light source 26.

Figure 4:
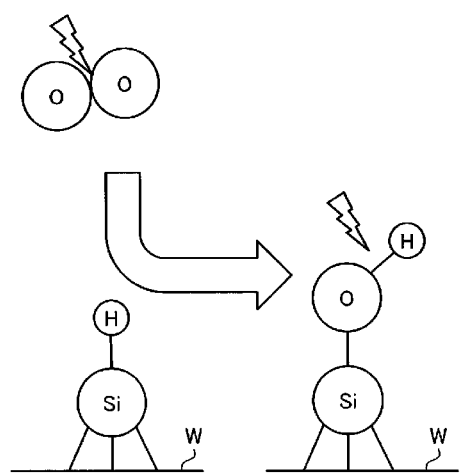
FIG. 4 is a view schematically illustrating a state of a molecule of an $O_2$ gas according to an embodiment.

FIG. 4 is a view schematically illustrating a state of a molecule of an $O_2$ gas according to an embodiment. When the $O_2$ gas is supplied to the processing container 12, the precursor of the aminosilane gas adsorbed onto the surface reacts with O radicals and is modified to form a silicon oxide film (SiO film). At this time, when irradiation is performed with ultraviolet light having a wavelength of 172 nm, it is possible to promote the modification.

As described above, the film formation apparatus 10 is able to accelerate the modification of the surface of the substrate W by irradiating the interior of the processing container 12 with ultraviolet light having a wavelength of 172 nm from the light source 26 while supplying the $O_2$ gas.

Subsequently, in step S4, the supply of the $O_2$ gas and the irradiation with ultraviolet light are stopped, the purge gas is supplied, and exhaust is performed to exhaust the nitrogen-containing gas from the internal space 12s.

The film formation apparatus 10 repeats steps S1 to S4 to form a silicon oxide film having a desired film thickness on the substrate W.

The flow of ALD is not limited to this. Irradiation with the ultraviolet light may be implemented in only one of steps S1 and S3. In addition, irradiation with ultraviolet light may be implemented in steps S2 and S4. For example, in step S2, by implementing irradiation with ultraviolet light having a wavelength in the range of 200 to 250 nm, it is possible to remove the amino groups remaining on the surface of the substrate W. In step S4, when irradiation is implemented with ultraviolet light having a wavelength in the range of 160 to 200 nm, it is possible to activate the surface of the substrate W. Ultraviolet light is easily absorbed by various molecules. Therefore, when irradiation is implemented with ultraviolet light for the purpose of modifying the surface of the substrate W, it is preferable to stop the supply of a purge gas or reduce the pressure to suppress the absorption of ultraviolet light by the gas.

As described above, in the film formation method according to this embodiment, a precursor of a raw material gas for film formation is adsorbed on the surface of the substrate W by irradiating the interior of the processing container 12 with ultraviolet light having a first wavelength that separates a predetermined bond of the raw material gas, while supplying a raw material gas for film formation into the processing container 12 in which the substrate W on which a film is to be formed is disposed. In the film formation method according to this embodiment, a layer in which the precursor and the reaction gas react with each other on the surface of the substrate W is formed by supplying the reaction gas into the processing container 12. Thus, with the film formation method of this embodiment, it is possible to control the reactivity of the raw material gas. As a result, with the film formation method according to the present embodiment, it is possible to control the reactivity in film formation.

The raw material gas is a gas having a SiN bond. The first wavelength is a wavelength in the range of 200 to 250 nm. The reaction gas is an oxidizing gas that oxidizes the precursor. Thus, with the film formation method according to this embodiment, it is possible to control the reactivity in a reaction in which a SiN bond acts.

The raw material gas is an aminosilane gas. The reaction gas is an oxygen gas. Thus, with the film formation method according to the present embodiment, it is possible to control the reactivity in forming a SiO film.

Further, in the film formation method according to this embodiment, the reaction gas is supplied into the processing container 12 while irradiating the interior of the processing container 12 with ultraviolet light having a second wavelength that promotes the reaction between the precursor and the reaction gas. Thus, with the film formation method according to this embodiment, it is possible to control the reactivity of the reaction between the precursor and the reaction gas. As a result, with the film formation method according to the present embodiment, it is possible to control the reactivity in film formation.

The second wavelength is a wavelength in the range of 160 to 200 nm. Thus, with the film formation method according to this embodiment, it is possible to promote the modification of the film.

In addition, in the film formation method according to the present embodiment, the interior of the processing container 12 is irradiated with ultraviolet light having a third wavelength in the step of purging the gas in the processing container 12. Thus, with the film formation method according to this embodiment, it is possible to remove amino groups remaining on the surface of the substrate W. In addition, by implementing irradiation with ultraviolet light in step S4, it is possible to activate the surface of the substrate W.

Although embodiments have been described above, it should be considered that the embodiments disclosed herein are exemplary in all respects and are not restrictive. Indeed, the embodiments described above can be implemented in various forms. In addition, the embodiment described above may be omitted, replaced, or modified in various forms without departing from the scope and spirit of the claims.

Figure 5:
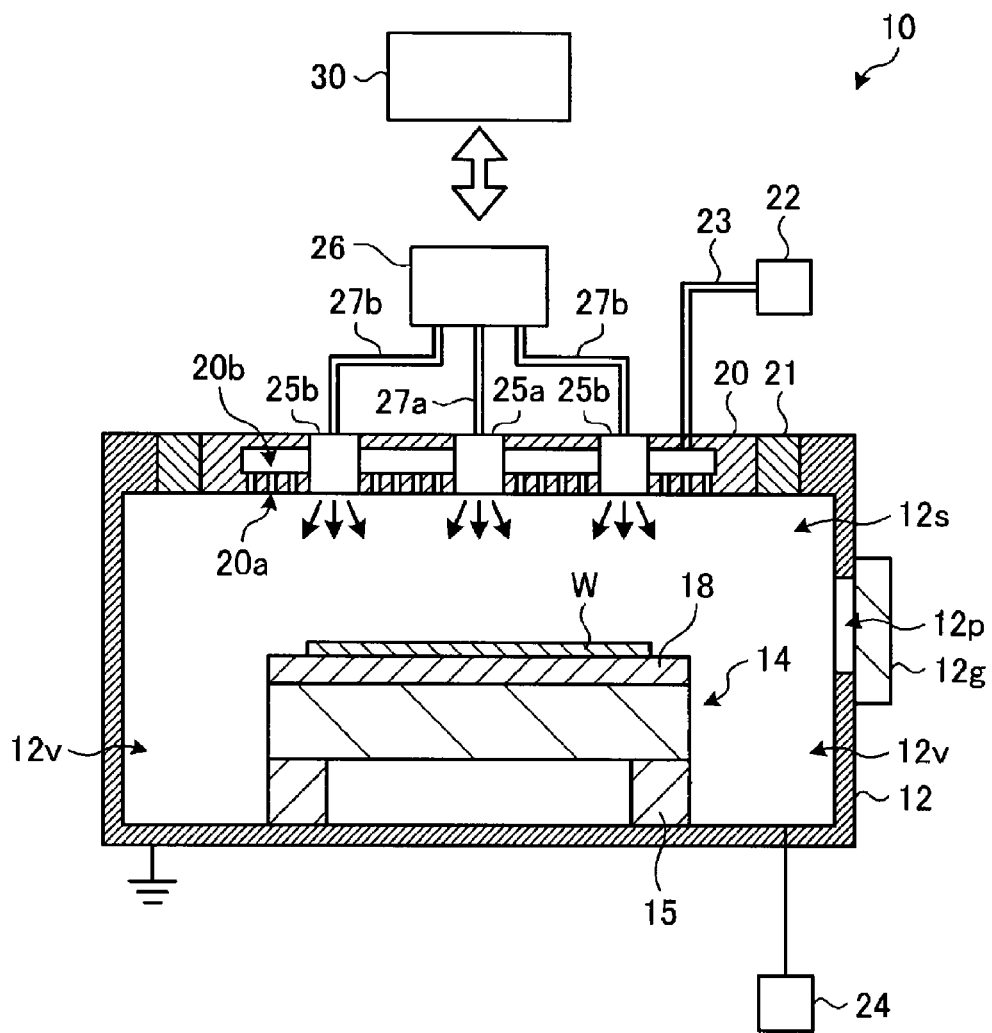
FIG. 5 is a view illustrating an example of another configuration of the film formation apparatus according to an embodiment.

In the embodiment, the case in which the interior of the processing container 12 is irradiated with ultraviolet light output from the light source 26 from one location (the transmission window 25) has been described as an example, but the present disclosure is not limited thereto. The film formation apparatus 10 may be configured to be capable of irradiating the interior of the processing container 12 with ultraviolet light from a plurality of locations. Further, the film formation apparatus 10 may be configured so that the irradiation amount with ultraviolet light can be partially changed in the processing container 12. FIG. 5 is a view illustrating an example of another configuration of the film formation apparatus according to an embodiment. In the film formation apparatus 10 illustrated in FIG. 5, a transmission window 25a is provided in the central portion of the shower head 20, and a transmission window 25b is provided in the peripheral portion of the shower head 20. The transmission window 25b may have an annular shape that is continuous in the circumferential direction of the shower head 20, or may have a shape that is separated into a plurality of portions in the circumferential direction. The light source 26 is connected to the transmission window 25a and the transmission window 25b via optical fibers 27a and 27b, respectively, and is configured to be capable of outputting ultraviolet light having a specific wavelength to each of the optical fibers 27a and 27b in a manner of controlling the irradiation amount. Here, in ALD, it is generally understood that, when a raw material gas, such as aminosilane gas, is supplied, the precursor is tightly adsorbed onto the surface of the substrate W so that the surface is saturated with one atomic layer. However, in practice, non-uniformity may occur. For example, in the film formation apparatus 10, when the raw material gas is ejected from the shower head 20, the concentration of the raw material gas is higher in the central portion of the shower head 20 than in the peripheral portion. Thus, some non-uniformity may occur in the adsorption of the precursor in the central portion and the peripheral portion of the substrate W. Therefore, the controller 30 may control the light source 26 such that irradiation is implemented with different irradiation amounts of ultraviolet light having a wavelength of 230 nm from the central portion and the peripheral portion of the shower head 20. For example, the controller 30 may cause the interior of the processing container 12 to be irradiated with ultraviolet light in a manner of controlling the irradiation amounts of the ultraviolet light output from the light source 26 to the optical fibers 27a and 27b such that the irradiation amount of ultraviolet light emitted from the transmission window 25a is larger than that emitted from the transmission window 25b. This makes it more difficult to adsorb the precursor of aminosilane in the central portion than in the peripheral portion of the shower head 20 so that non-uniform adsorption of the precursor in the central portion and the peripheral portion of the substrate W can be suppressed.

In the embodiments, the case in which the shower head 20 is provided with the transmission window 25 to transmit the ultraviolet light output from the light source 26 through the transmission window 25 and to irradiate the interior of the processing container 12 with the ultraviolet light has been described as an example, but the present disclosure is limited thereto. The film formation apparatus 10 may be provided with the light source 26 in the processing container 12 to directly irradiate the interior of the processing container 12 with ultraviolet light.

In the embodiments, the case in which the substrate W is a semiconductor wafer has been described as an example, but the present disclosure is not limited thereto. The substrate W may be silicon or a compound semiconductor of, for example, GaAs, SiC, or GaN. In addition, the substrate W may be a glass substrate used for a flat panel display (FPD) such as a liquid crystal display device, a ceramic substrate, or the like.

EXPLANATION OF REFERENCE NUMERALS

10: film formation apparatus
12: processing container
20: shower head
22: gas supplier
26: light source
25, 25a, 25b: transmission window
27, 27a, 27b: optical fiber
30: controller
W: substrate

What is claimed is:
1. A film formation method comprising:
adsorbing a precursor of a raw material gas onto a surface of a substrate on which a film is to be formed by irradiating an interior of a processing container with ultraviolet light having a first wavelength that separates a predetermined bond of the raw material gas while supplying the raw material gas into the processing container in which the substrate is disposed; and forming a layer, in which the precursor and a reaction gas react on the surface of the substrate, by supplying the reaction gas into the processing container, wherein, in the forming the layer, the reaction gas is supplied into the processing container while irradiating the interior of the processing container with ultraviolet light having a second wavelength that promotes the reaction between the precursor and the reaction gas, and wherein the first wavelength is different from the second wavelength.

2. The film formation method of claim 1, wherein the raw material gas is a gas having a SiN bond, the first wavelength is a wavelength in a range of 200 to 250 nm, and the reaction gas is an oxidizing gas that oxidizes the precursor.

3. The film formation method of claim 2, wherein the raw material gas is an aminosilane gas, and the reaction gas is an oxygen gas.

4. The film formation method of claim 1, wherein the second wavelength is a wavelength in a range of 160 to 200 nm.

5. The film formation method of claim 1, further comprising:

purging gas in the interior of the processing container between the adsorbing the precursor and the forming the layer, and after the forming the layer, wherein, in the purging the gas, the interior of the processing container is irradiated with ultraviolet light having a third wavelength.

* * * * *